(12) United States Patent
Tan et al.

(10) Patent No.: US 12,094,755 B2
(45) Date of Patent: Sep. 17, 2024

(54) PROTECTION MECHANISM AND METHOD FOR PROTECTING WAFER AND PIN

(71) Applicant: Piotech Inc., Shenyang (CN)

(72) Inventors: Huaqiang Tan, Shenyang (CN); Yanchao Yin, Shenyang (CN)

(73) Assignee: Piotech Inc., Shenyang (CN)

( * ) Notice: Subject to any disclaimer, the term of this patent is extended or adjusted under 35 U.S.C. 154(b) by 410 days.

(21) Appl. No.: 17/542,668

(22) Filed: Dec. 6, 2021

(65) Prior Publication Data
US 2022/0208598 A1    Jun. 30, 2022

(30) Foreign Application Priority Data

Dec. 31, 2020  (CN) .......................... 202011642970.3

(51) Int. Cl.
  *H01L 21/687*   (2006.01)
(52) U.S. Cl.
  CPC .............................. *H01L 21/68785* (2013.01)
(58) Field of Classification Search
  CPC ......... H01L 21/68742; H01L 21/67288; H01L 21/37253; H01L 21/68785; H01L 21/68792
  See application file for complete search history.

(56) References Cited

U.S. PATENT DOCUMENTS

| | | | | |
|---|---|---|---|---|
| 5,421,893 A | * | 6/1995 | Perlov | H01L 21/68792 118/725 |
| 7,292,428 B2 | * | 11/2007 | Hanawa | H01L 21/68742 361/234 |
| 10,883,190 B2 | * | 1/2021 | Tong | C30B 25/10 |
| 10,998,219 B2 | * | 5/2021 | Hu | H01L 21/68742 |
| 11,139,195 B2 | * | 10/2021 | Ha | H01L 21/68742 |
| 2002/0141133 A1 | * | 10/2002 | Anderson | H01L 21/68742 279/128 |
| 2003/0075109 A1 | * | 4/2003 | Arai | H01L 21/68742 118/728 |

(Continued)

FOREIGN PATENT DOCUMENTS

| | | |
|---|---|---|
| TW | M493147 U | 1/2015 |
| TW | I511190 B | 12/2015 |

OTHER PUBLICATIONS

First Office Action issued Nov. 16, 2022 in counterpart Taiwan Patent Application No. 110144705.

*Primary Examiner* — Seahee Hong
(74) *Attorney, Agent, or Firm* — Blank Rome LLP

(57) ABSTRACT

This application provides a protection mechanism and a method for protecting a wafer and a pin. The protection mechanism includes: a drive; a linear unit, connected to the drive, so as to cause a pin to eject a wafer under the action of the drive; a torsion meter, configured to measure a torque of the protection mechanism in a process of ejecting the wafer by the pin; and a control module, configured to receive the torque measured by the torsion meter, and compare the torque with a predetermined value. The torsion meter is disposed between the drive and the linear unit. The to protection mechanism can effectively measure, in real time, a torque generated in a process of ejecting the wafer, and can determine, according to the torque, whether an abnormality occurs in the ejection process, so that an accident such as wafer fragmentation or pin fracturing can be effectively prevented.

16 Claims, 6 Drawing Sheets

(56) References Cited

U.S. PATENT DOCUMENTS

| | | | |
|---|---|---|---|
| 2004/0177813 A1* | 9/2004 | Schieve | H01L 21/68742 118/728 |
| 2011/0111601 A1* | 5/2011 | Okita | H01L 21/68742 156/345.24 |
| 2011/0236162 A1* | 9/2011 | Shikayama | H01L 21/68742 414/222.01 |
| 2012/0142144 A1 | 6/2012 | Taheri | |
| 2018/0315959 A1* | 11/2018 | Sun | H01L 21/68764 |
| 2019/0074209 A1* | 3/2019 | Sasaki | H01L 21/68742 |
| 2020/0194299 A1 | 6/2020 | Balasubramanian et al. | |

* cited by examiner

PROTECTION MECHANISM AND METHOD FOR PROTECTING WAFER AND PIN

CROSS-REFERENCE TO RELATED APPLICATIONS

This application claims priority to Chinese Patent Application No. 202011642970.3 filed on Dec. 31, 2020, and all the benefits accruing therefrom under 35 U.S.C. § 119, the contents of which in its entirety are herein incorporated by reference.

BACKGROUND OF THE INVENTION

1. Field of the Invention

This application relates to the field of semiconductor wafer and substrate treatment, and in particular, to a protection mechanism and a method for protecting a wafer in a semiconductor treatment chamber and a pin for ejecting the wafer.

2. Description of the Related Art

A wafer or a substrate is a base used for preparing a semiconductor apparatus. To prepare the semiconductor apparatus (for example, an integrated circuit or a semiconductor light-emitting apparatus), the wafer or the substrate needs to be placed in a semiconductor treatment chamber for heating and deposition treatment (for example, chemical vapor deposition (CVD) or plasma-enhanced chemical vapor deposition (PECVD)). During the treatment, the wafer is placed on a wafer carrying apparatus (for example, a heater or an electrostatic chuck), and is adsorbed and fixed by an electrostatic force or vacuum suction. After being treated, the wafer needs to be ejected by using a pin.

However, in a process of ejecting the wafer, because there is still the electrostatic force or the vacuum suction, or due to another reason including a radio frequency (RF) effect or an external force, the wafer may not be ejected smoothly. In addition, if the ejection is not stopped in time when resistance is encountered in the ejection process, an accident of wafer fragmentation or pin fracture will be caused. This not only affects the pass rate of wafer products, but also may cause shutdown of the entire device (for example, to replace a fractured pin). As a result, the production efficiency is reduced.

In the prior art, there is no device or method that can effectively measure, in real time, a release degree of the electrostatic force or a vacuum suction in the process of ejecting the wafer by the pin. Therefore, neither a force status of the pin nor a state of the wafer (for example, whether the wafer has been deformed or fragmented) can be understood or determined.

Therefore, it is necessary to improve the prior art to resolve the foregoing technical problems.

SUMMARY OF THE INVENTION

This application aims to resolve at least one of the foregoing problems in the prior art.

An object of this application is to provide a protection mechanism for protecting a wafer and a pin, which can effectively measure, in real time, a torque generated in a process of ejecting the wafer, and can determine, according to the torque, whether an abnormality occurs in the ejection process.

Another object of this application is to provide a method for protecting a wafer and a pin. According to the method, a torque generated in a process of ejecting the wafer can be effectively measured in real time, and whether an abnormality occurs in the ejection process can be determined according to the torque.

A protection mechanism is provided according to this application, the protection mechanism including: a drive; a linear unit, connected to the drive, so as to cause a pin to eject a wafer under the action of the drive; a torsion meter, configured to measure a torque of the protection mechanism in a process of ejecting the wafer by the pin; and a control module, configured to receive the torque measured by the torsion meter, and compare the torque with a predetermined value.

Preferably, the torsion meter is disposed between the drive and the linear unit.

Preferably, the protection mechanism further includes a first connector and a second connector. The first connector is disposed between the drive and the torsion meter. The second connector is disposed between the torsion meter and the linear unit.

Preferably, if the torque exceeds an allowable range of the predetermined value, the control module will send an alarm signal and/or stops the drive from driving.

Preferably, the predetermined value is a reference torque pre-measured by the torsion meter when the wafer is normally ejected. The predetermined value linearly decreases with a distance of the pin away from an original position.

Preferably, the allowable range of the predetermined value is 0.7 to 1.3 times the reference torque.

In an implementation of this application, the protection mechanism further includes a pin support plate for pushing against the pin. The linear unit is connected between the drive and the pin support plate, to push against the pin by using the pin support plate, so that the pin moves upward to eject the wafer.

In the foregoing embodiment, preferably, the pin support plate is sleeved on a central shaft of a wafer carrying apparatus. The linear unit is disposed parallel to the central shaft of the wafer carrying apparatus, and separated from the central shaft.

In another implementation of this application, the linear unit is connected between the drive and a wafer carrying apparatus, so that the wafer carrying apparatus moves downward to cause the pin to eject the wafer.

In the foregoing embodiment, preferably, there are a plurality of pins. The pins are disposed parallel to each other through the wafer carrying apparatus. One end of the pin is fixed to the bottom of a cavity, and the other end is protrudable from the wafer carrying apparatus.

In the foregoing embodiment, preferably, the linear unit is connected to a central shaft of the wafer carrying apparatus.

A method for protecting a wafer and a pin is provided according to this application, the method including: driving a linear unit by using a drive, so as to cause the pin to eject the wafer; measuring a torque from the linear unit by using a torsion meter; and receiving, by using a control module, the torque from the torsion meter, and comparing the torque with a predetermined value.

Preferably, if the torque exceeds an allowable range of the predetermined value, the control module is used to send an alarm signal and/or stop the drive from driving.

Preferably, the predetermined value is a reference torque pre-measured by the torsion meter when the wafer is normally ejected. The predetermined value linearly decreases with a distance of the pin away from an original position.

Preferably, the allowable range of the predetermined value is 0.7 to 1.3 times the reference torque.

In an implementation of this application, the linear unit is used to push against a pin support plate, and the pin support plate further pushes against the pin, so that the pin moves upward to eject the wafer.

Preferably, the pin support plate is sleeved on a central shaft of a wafer carrying apparatus. The linear unit is disposed parallel to the central shaft of the wafer carrying apparatus, and separated from the central shaft.

In another implementation of this application, the linear unit is used to pull down a wafer carrying apparatus, so that the wafer carrying apparatus moves downward to cause the pin to eject the wafer.

Preferably, there are a plurality of pins. The pins are disposed parallel to each other in the wafer carrying apparatus. One end of the pin is fixed to the bottom of a cavity, and the other end is protrudable from the wafer carrying apparatus.

Preferably, the linear unit is connected to a central shaft of the wafer carrying apparatus.

Compared with the prior art, the protection mechanism and protection method provided according to this application can produce the following superior technical effects:

A torsion meter is used to measure a torque of the protection mechanism in a process of ejecting a wafer by a pin, a measured torque signal is transmitted to a control module, and the control module further compares the measured torque with a predetermined value, to determine whether an abnormality occurs in the process of ejecting the wafer. For example, if the measured torque is too large or too small, and exceeds an allowable range of the predetermined value, it indicates that an abnormality occurs. In this case, the control module can stop driving and/or send an alarm signal. Therefore, an accident such as wafer fragmentation or pin fracturing can be effectively prevented. In addition, an operator can find an abnormal situation and intervene in time, which not only helps to improve the pass rate of products, but also improves the operating efficiency.

BRIEF DESCRIPTION OF THE DRAWINGS

To describe the specific implementations and the produced technical effects of this application more clearly, the specific embodiments of this application are described below with reference to the accompanying drawings. To express clearly and facilitate arrangement of the drawings, the accompanying drawings are not completely drawn to scale. For example, some of the drawings are enlarged to show partial details, and some of the drawings are shrunk to show an overall structure. In the drawings:

FIG. 2B shows a state of an abnormality occurring when a wafer is ejected;

FIG. 3B shows a state of an abnormality occurring when a wafer is ejected.

PREFERRED EMBODIMENT OF THE PRESENT INVENTION

The following describes in detail the embodiments of this application with reference to the accompanying drawings. Various aspects of this application are easier to be understood by reading the following descriptions of the specific embodiments with reference to the accompanying drawings. It should be noted that these embodiments are merely examples and used to explain and illustrate the technical solutions of this application, and are not intended to limit this application. Those skilled in the art may make various modifications and variations based on these embodiments, and all technical solutions obtained by equivalent transformations shall fall within the protection scope of this application. The names of various components are used in this specification for illustration purposes only, and do not have a limiting effect. Different manufacturers may use different names to refer to components having the same function.

Figure 1:
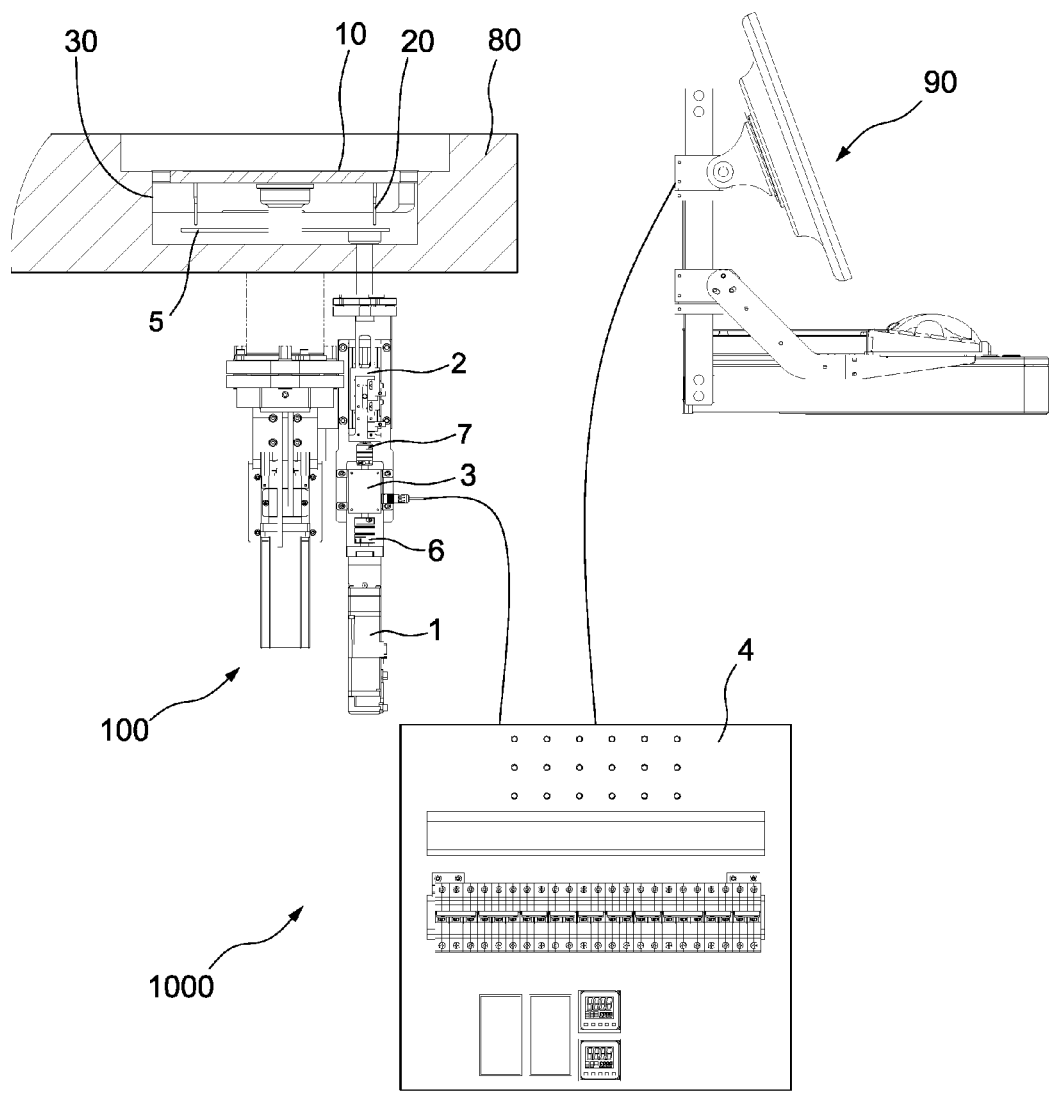
FIG. 1 is a schematic diagram of an overall structure of a semiconductor treatment device of a protection mechanism according to an embodiment of this application, in which a treatment chamber is shown in a cross-sectional view.

Referring to FIG. 1, a protection mechanism 100 provided according to this application is used to protect a wafer 10 and a pin 20 used to eject the wafer 10, to prevent fracturing of the pin 20 in a process of ejecting the wafer 10 or unexpected deformation or fragmentation of the wafer 10. The protection mechanism 100 is a part of a semiconductor treatment device 1000, and is partially disposed inside a cavity 80 and partially outside the cavity 80.

In an embodiment of this application, the protection mechanism 100 generally includes: a drive 1; a linear unit 2, connected between the drive 1 and the pin 20, so as to cause the pin 20 to move upward to eject the wafer 10 under the action of the drive 1; a torsion meter 3, configured to measure a torque of the protection mechanism in a process of ejecting the wafer 10 by the pin 20; and a control module 4, configured to receive the torque measured by the torsion meter 3, and compare the torque with a predetermined value.

As shown in FIG. 1, the semiconductor treatment device 1000 additionally includes an industrial computer 90. The control module 4 and the industrial computer 90 are connected to each other through a signal line. The torsion meter 3 and the control module 4 are also connected to each other through a signal line, so that a signal can be transmitted between the two. An operator may perform an operation on the industrial computer 90 to perform control through the control module 4. Certainly, the operator can also directly perform an operation on the control module 4.

Figure 2A:
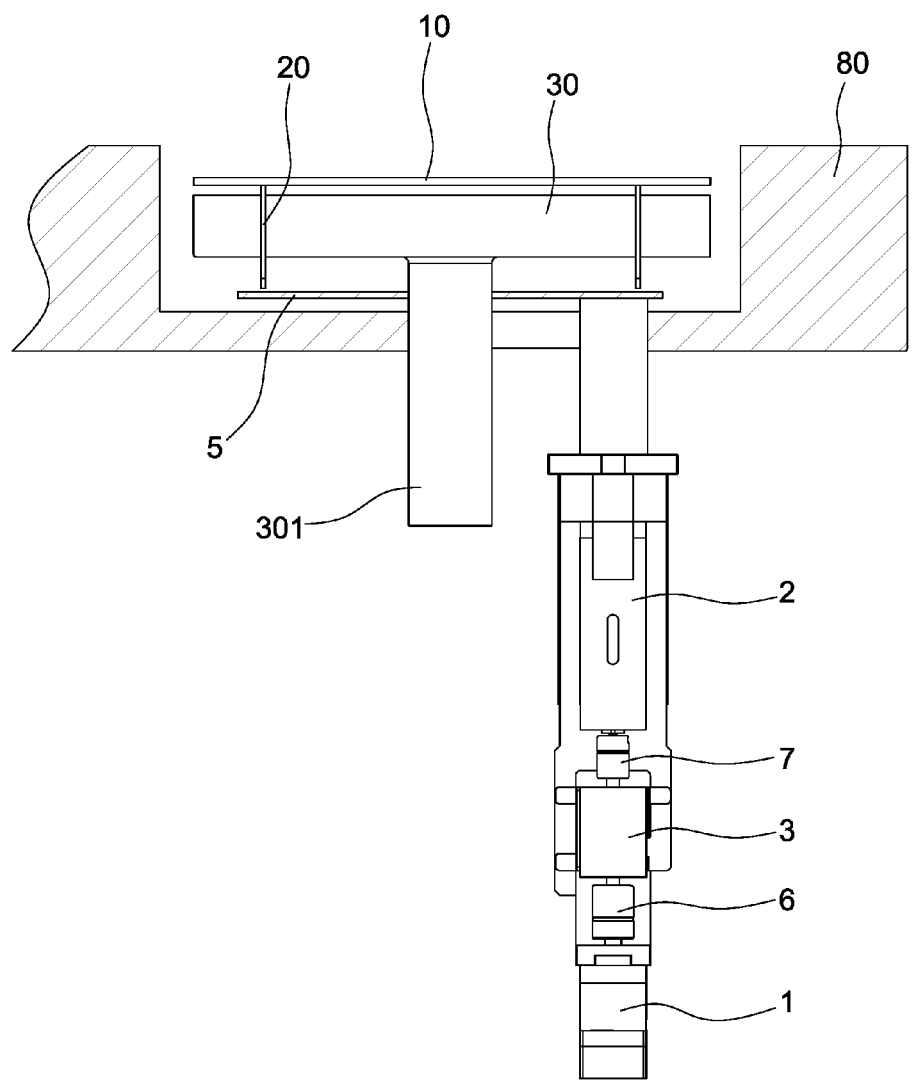
FIG. 2A is a schematic cross-sectional view of a protection mechanism according to an embodiment of this application (a control module is not shown), which shows a state of normally ejecting a wafer.

Further, FIG. 2A shows the structure according to the foregoing embodiment of this application except the control module 4.

Specifically, viewing from top to bottom, the protection mechanism includes: a plurality of pins 20, a pin support plate 5, a linear unit 2, a second connector 7, a torsion meter 3, a first connector 6, and a drive 1.

The plurality of pins 20 are disposed parallel to each other through a wafer carrying apparatus 30, and are in clearance fit with corresponding holes in the wafer carrying apparatus

30. The wafer carrying apparatus 30 may be a heater having an electrostatic adsorption function. The pins 20 can perform rising motion and falling motion to eject the wafer 10 and reset. The rising motion is due to pushing of the pin support plate 5, and the falling motion is due to the gravity of the pins.

The pin support plate 5 is located below the plurality of pins 20, and is used for pushing against the plurality of pins 20. The pin support plate 5 is fixed to an upper end of the linear unit 2 and therefore can rise or fall together with the linear unit 2.

The linear unit 2 is used for converting rotary motion into linear motion, and may be, for example, a lead screw mechanism. The upper end of the linear unit 2 is located below the pin support plate 5 and is fixedly connected to the pin support plate 5, to drive the pin support plate 5 to rise and fall. A lower end of the linear unit is connected to the second connector 7 (may be, for example, a coupling), and is connected to the torsion meter 3 through the second connector 7. As shown in the figure, the pin support plate 5 is sleeved on a central shaft 301 of the wafer carrying apparatus 30. The linear unit 2 is disposed parallel to the central shaft 301 of the wafer carrying apparatus 30, and separated from the central shaft.

The torsion meter 3 is disposed between the drive 1 and the linear unit 2, an upper end of the torsion meter 3 is connected to the linear unit 2 through the second connector 7, and a lower end of the torsion meter 3 is connected to the drive 1 through the first connector 6 (may be, for example, a coupling).

The drive 1 is used to generate power, and may be, for example, an electric motor.

Working processes and principles of the foregoing protection mechanism are described as follows:

When the wafer 10 needs to be ejected, the drive 1 is first turned on to generate power (that is, rotary motion). The rotary motion is transmitted to the linear unit 2 through the first connector 6, the torsion meter 3, and the second connector 7. The linear unit 2 converts the rotary motion into linear motion, so that the pin support plate 5 moves upward and pushes against the plurality of pins 20, to cause the plurality of pins 20 to move upward at the same time. Then, the upper ends of the plurality of pins 20 protrude from the wafer carrying apparatus 30 and upwardly push against the wafer 10 located on a surface of the wafer carrying apparatus 30.

In this period, the torsion meter 3 continuously measures the torque of the protection mechanism and transmits a torque signal to the control module 4. If the measured torque exceeds an allowable range of the predetermined value, that is, an abnormal situation occurs, the control module 4 will send an alarm signal to remind the operator to intervene. Alternatively, the control module 4 stops the drive 1 from driving, to prevent the pins 20 from fracturing or the wafer 10 from being damaged due to continuous driving. Alternatively, the control module 4 sends the alarm signal and stops the drive 1 from driving.

For example, if the process of ejecting the wafer 10 is shown in FIG. 2A, that is, the wafer 10 is ejected normally and no abnormal state occurs, the control module 4 controls the drive 1 to work normally without sending an alarm signal or stopping the drive 1 from driving.

Figure 2B:
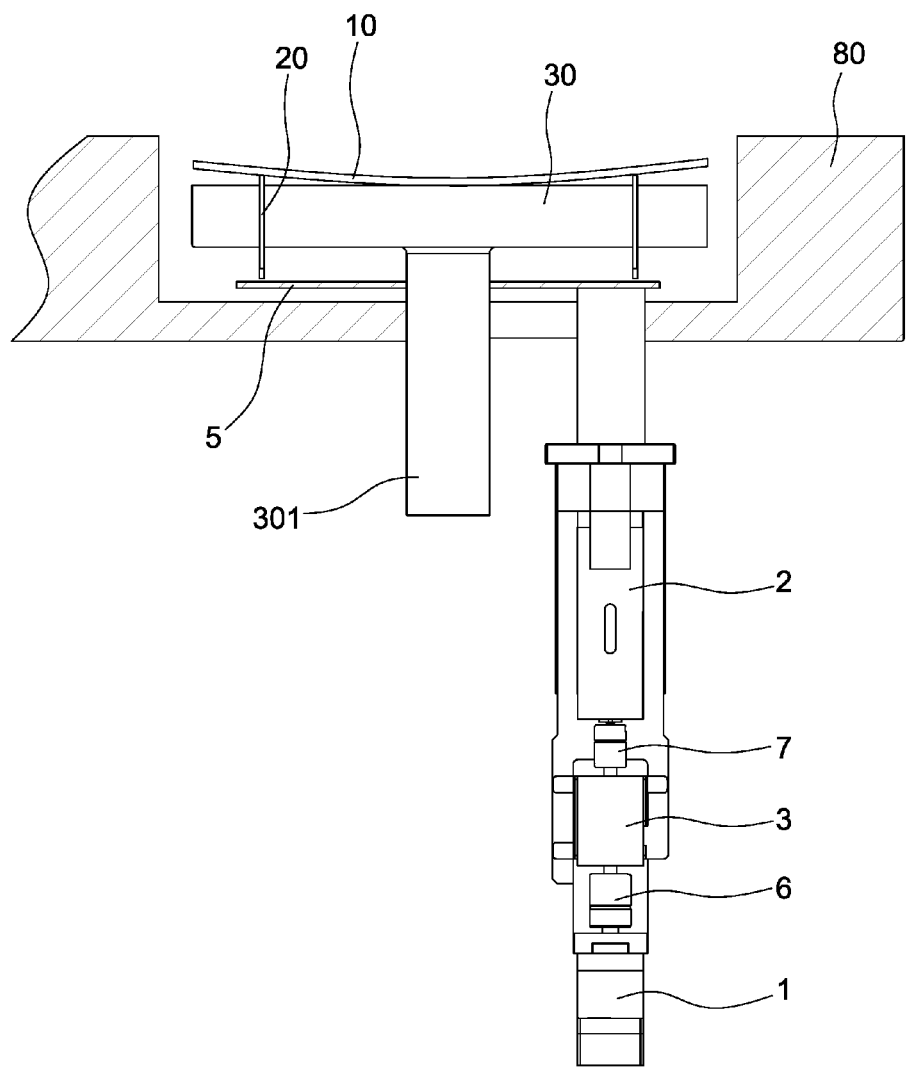
FIG. 2B also shows a schematic cross-sectional view of the protection mechanism shown in FIG. 2A, and different from FIG. 2A.

However, if the process of ejecting the wafer 10 is shown in FIG. 2B, and the wafer 10 is bent beyond a proper range, the torsion meter 3 will measure the torque of the protection mechanism exceeding the allowable range of the predetermined value, and will transmit the torque signal to the control module 4. In this case, the control module 4 immediately sends the alarm signal to remind the operator to intervene, or stops the drive 1 from driving, or sends the alarm signal and stops the drive 1 from driving, to prevent the pins 20 from fracturing or the wafer 10 from being damaged due to continuous driving.

Apparently, compared with the device in the prior art that cannot effectively measure, in real time, a force status of the pin and a state of the wafer in the process of ejecting the wafer by the pin, the protection mechanism in this application greatly helps to improve the pass rate of wafer products and effectively prevents the pins 20 from fracturing, thereby improving the production efficiency.

Figure 3A:
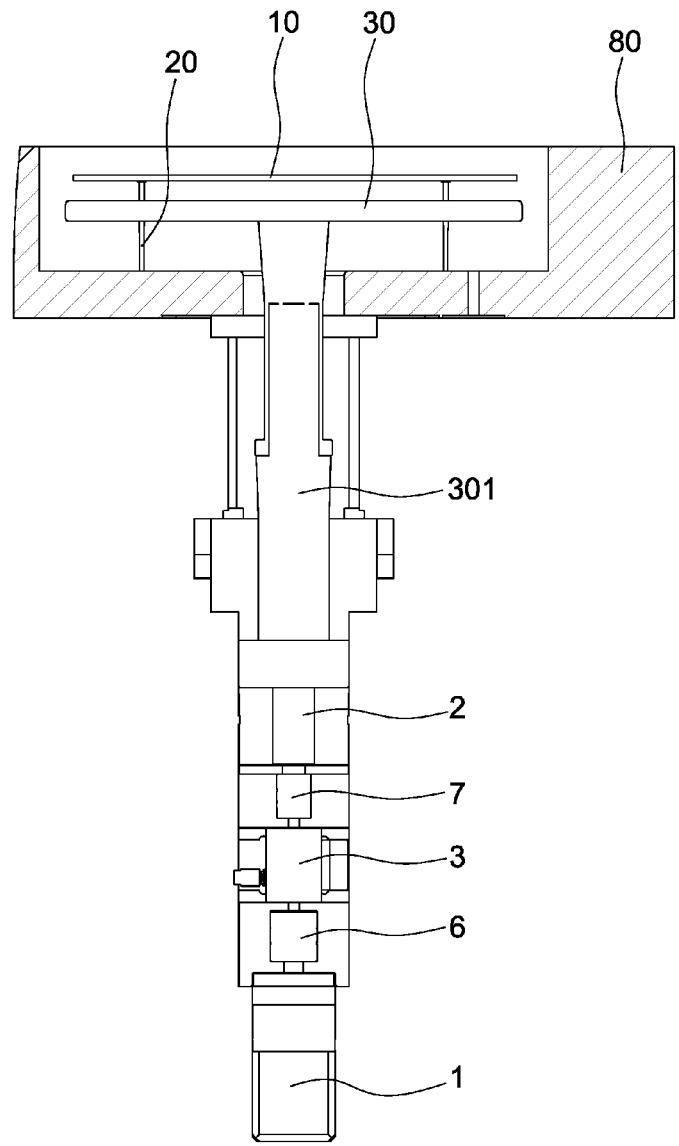
FIG. 3A is a schematic cross-sectional view of a protection mechanism according to another embodiment of this application (a control module is not shown), which shows a state of normally ejecting a wafer.
Figure 3B:
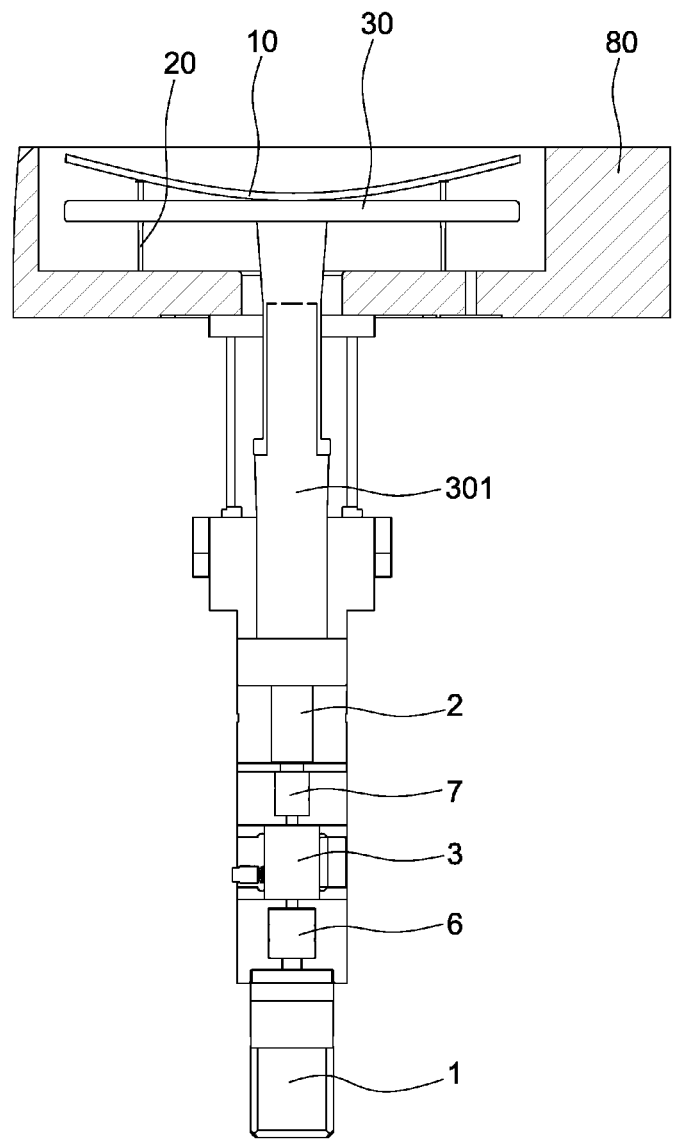
FIG. 3B also shows a schematic cross-sectional view of the protection mechanism shown in FIG. 3A, and different from FIG. 3A.

FIG. 3A and FIG. 3B show a protection mechanism of another embodiment of this application. Different from the foregoing embodiment, pins 20 in this embodiment remain still, while a drive 1 drives a wafer carrying apparatus 30 to perform rising motion and falling motion. When the wafer carrying apparatus 30 falls, the wafer 10 will be ejected by protruding of the pin 20.

Specifically, the protection mechanism includes: a drive 1; a linear unit 2, connected between the drive 1 and the wafer carrying apparatus 30, so that the wafer carrying apparatus 30 performs rising motion and falling motion under the action of the drive 1 to help the pin 20 to eject the wafer; a torsion meter 3, configured to measure a torque of the protection mechanism in a process of ejecting the wafer 10 by the pin 20; and a control module 4, configured to receive the torque measured by the torsion meter 3, and compare the torque with a predetermined value.

More specifically, referring to FIG. 3A and FIG. 3B and viewing from top to bottom, the protection mechanism includes: a plurality of pins 20, a linear unit 2, a second connector 7, a torsion meter 3, a first connector 6, and a drive 1.

The plurality of pins 20 are disposed parallel to each other in the wafer carrying apparatus 30. One end of the pin is fixed to the bottom of a cavity 80, and the other end is protrudable from the wafer carrying apparatus 30.

An upper end of the linear unit 2 is connected to a central shaft 301 of the wafer carrying apparatus 30, and a lower end of the linear unit 2 is connected to the torsion meter 3 through the second connector 7. A lower end of the torsion meter 3 is connected to the drive 1 through the first connector 6.

The drive 1, the linear unit 2, the first connector 6, and the second connector 7 can each adopt a structure similar to that in the foregoing embodiment.

Working processes and principles of the protection mechanism of this embodiment are similar to those of the foregoing embodiment, and are briefly described as follows:

When the wafer 10 needs to be ejected, the drive 1 is first turned on to generate power (that is, rotary motion). The rotary motion is transmitted to the linear unit 2 through the first connector 6, the torsion meter 3, and the second connector 7. The linear unit 2 converts the rotary motion into linear motion, and causes the wafer carrying apparatus 30 to fall, so that the pins 20 protrude from the top of the wafer carrying apparatus 30, and the wafer 10 on a surface of the wafer carrying apparatus 30 is ejected by protruding of the pins.

In this period, the torsion meter 3 continuously measures the torque of the protection mechanism and transmits a torque signal to the control module 4. If the torque exceeds an allowable range of the predetermined value, that is, an abnormal situation occurs, the control module 4 will send an alarm signal to remind the operator to intervene. Alternatively, the control module 4 stops the drive 1 from driving, to prevent the pins 20 from fracturing or the wafer 10 from being damaged due to continuous driving. Alternatively, the control module 4 sends the alarm signal and stops the drive 1 from driving.

For example, if the process of ejecting the wafer 10 is shown in FIG. 3A, that is, the wafer 10 is ejected normally and no abnormal state occurs, the control module 4 controls the drive to work normally without sending an alarm signal or stopping the drive 1 from driving.

However, if the process of ejecting the wafer 10 is shown in FIG. 3B, and the wafer 10 is bent beyond a proper range, the torsion meter 3 will measure the torque of the protection mechanism exceeding the allowable range of the predetermined value, and will transmit the torque signal to the control module 4. In this case, the control module 4 immediately sends the alarm signal to remind the operator to intervene, or stops the drive 1 from driving, or sends the alarm signal and stops the drive 1 from driving, to prevent the pins 20 from fracturing or the wafer 10 from being damaged due to continuous driving.

Correspondingly, this application further provides methods for protecting the wafer 10 and the pin 20 respectively corresponding to the above two embodiments.

Specifically, a method for protecting the wafer 10 and the pin 20 provided according to this application includes: driving a linear unit 2 by using a drive 1, so as to cause the pin 20 to eject the wafer 10; measuring a torque from the linear unit 2 by using a torsion meter 3; and receiving, by using a control module 4, the torque from the torsion meter 3, and comparing the torque with a predetermined value.

In the foregoing method, if the measured torque exceeds an allowable range of the predetermined value, the control module 4 will be used to send an alarm signal and/or stop the drive 1 from driving.

In an embodiment of the foregoing method, the linear unit 2 is used to push against a pin support plate 5, and the pin support plate 5 further pushes against the pin 20, so that the pin moves upward to eject the wafer 10.

In the protection mechanism implementing the method, as shown in FIG. 2A and FIG. 2B, the pin support plate 5 is sleeved on a central shaft 301 of the wafer carrying apparatus 30. The linear unit 2 is disposed parallel to the central shaft 301 of the wafer carrying apparatus 30, and separated from the central shaft. The pin 20 runs through the wafer carrying apparatus 30 and can perform rising motion and falling motion to eject the wafer 10 and reset.

When producing the protection mechanism, the following steps can be followed: providing the drive 1, the torsion meter 3, and the linear unit 2, and connecting them in sequence, where one end of the linear unit 2 is connected to the torsion meter 3, and the other end of the linear unit 2 may push against the pin 20; and providing the control module 4, and communicatively connecting the control module to the torsion meter 3 (for example, through a signal line).

In a process of ejecting the wafer 10 by the pin 20, a torque from the linear unit 2 is measured by using the torsion meter 3; and the control module 4 is used to receive the torque from the torsion meter 3, and compare the measured torque with a predetermined value. If the measured torque exceeds the allowable range of the predetermined value, the control module 4 is used to send an alarm signal and/or stop the drive 1 from driving.

For example, if the process of ejecting the wafer 10 is shown in FIG. 2B, and the wafer 10 is bent beyond a proper range, the torsion meter 3 measures the torque of the protection mechanism exceeding the allowable range of the predetermined value, and transmits the torque signal to the control module 4. In this case, the control module 4 immediately sends the alarm signal to remind the operator to intervene, or stops the drive 1 from driving, or sends the alarm signal and stops the drive 1 from driving, to prevent the pin 20 from fracturing or the wafer 10 from being damaged due to continuous driving.

In this embodiment, there are a plurality of pins 20 and the pins are disposed parallel to each other through the wafer carrying apparatus 30. The method further includes providing a pin support plate 5 for pushing against the plurality of pins 20, and locating the other end of the linear unit 2 below the pin support plate 5 and fixedly connecting the other end of the linear unit 2 to the pin support plate 5, to drive the pin support plate 5 to rise and fall.

Preferably, the method further includes providing a first connector 6 and a second connector 7, disposing the first connector 6 between the drive 1 and the torsion meter 3, and disposing the second connector 7 between the torsion meter 3 and the linear unit 2.

In another embodiment of the foregoing method, the linear unit 2 is used to pull down a wafer carrying apparatus 30, so that the wafer carrying apparatus 30 moves downward to cause the pin 20 to eject the wafer 10.

Preferably, there are a plurality of pins 20. The pins are disposed parallel to each other through the wafer carrying apparatus 30. One end of the pin is fixed to the bottom of a cavity 80, and the other end is protrudable from the wafer carrying apparatus 30. The linear unit 2 is connected to a central shaft 301 of the wafer carrying apparatus 30.

When producing the protection mechanism, the following steps can be followed: providing the drive 1, the torsion meter 3, and the linear unit 2, and connecting them in sequence, where one end of the linear unit 2 is connected to the torsion meter 3, and the other end of the linear unit 2 is connected to the wafer carrying apparatus 30 to cause the wafer carrying apparatus 30 to perform rising motion and falling motion under the action of the drive 1; and providing the control module 4. Preferably, the other end of the linear unit 2 is connected to the central shaft 301 of the wafer carrying apparatus 30, as shown in FIG. 3A and FIG. 3B.

In a process of ejecting the wafer 10 by the pin 20, a torque from the linear unit 2 is measured by using the torsion meter 3; and the control module 4 is used to receive the torque measured by the torsion meter 3, and compare the torque with a predetermined value. If the torque exceeds an allowable range of the predetermined value, the control module 4 is used to send an alarm signal and/or stop the drive 1 from driving.

For example, if the process of ejecting the wafer 10 is shown in FIG. 3B, and the wafer 10 is bent beyond a proper range, the torsion meter 3 measures the torque of the protection mechanism exceeding the allowable range of the predetermined value, and transmits the torque signal to the control module 4. In this case, the control module 4 immediately sends the alarm signal to remind the operator to intervene, or stops the drive 1 from driving, or sends the alarm signal and stops the drive 1 from driving, to prevent the pin 20 from fracturing or the wafer 10 from being damaged due to continuous driving.

Preferably, the method further includes providing a first connector 6 and a second connector 7, disposing the first connector 6 between the drive 1 and the torsion meter 3, and disposing the second connector 7 between the torsion meter 3 and the linear unit 2.

Figure 4:
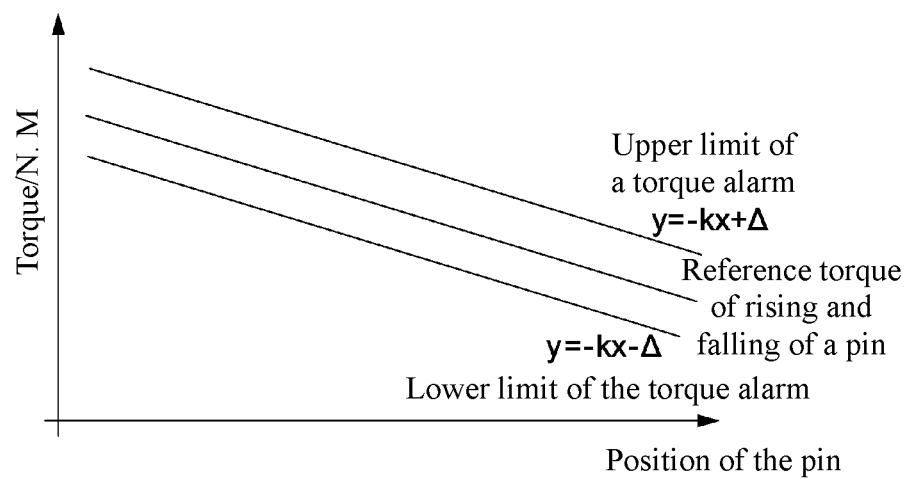
FIG. 4 is a schematic coordinate diagram of a relationship between a position of a pin and a torque, which schematically shows a predetermined value of the torque (that is, a reference torque) and an allowable range thereof (that is, within a range of an upper limit and a lower limit of the torque alarm).

Referring to FIG. 4, in the foregoing embodiments of the protection mechanisms and protection methods, the predetermined value is a reference torque pre-measured by the torsion meter 3 when the wafer 10 is normally separated from the wafer carrying apparatus 30. As shown in the figure, the reference torque linearly decreases with a distance of the pin 20 away from an original position, which can be measured through an experiment. Then the data is stored in the control module 4.

Preferably, the allowable range of the predetermined value is 0.7 to 1.3 times the reference torque, which can be set in the control module 4. That is, if the measured torque is less than 0.7 times the reference torque or greater than 1.3 times the reference torque, it indicates that an abnormal situation occurs in the ejection process. In this case, the control module 4 immediately sends the alarm signal to remind the operator to intervene, or stops the drive 1 from driving, or performs the two actions at the same time, to prevent the pin 20 from fracturing or the wafer 10 from being damaged due to continuous driving.

Certainly, more preferably, the allowable range of the predetermined value can be set to 0.8 to 1.2 times the reference torque, or 0.9 to 1.1 times the reference torque, so that more accurate real-time monitoring and protection can be implemented.

Technical content and technical features of this application are described by the foregoing related embodiments. However, the foregoing embodiments are merely examples for implementing this application. Persons skilled in the art may still make replacements and modifications based on the teachings and the disclosure of this application without departing from the spirit of this application. Therefore, the disclosed embodiments of this application do not limit the scope of this application. On the contrary, modifications and equivalent arrangements included in the spirit and scope of the claims are all included in the scope of this application.

What is claimed is:

1. A protection mechanism, comprising:
   a drive;
   a linear unit connected to the drive, such that the drive is configured to drive the linear unit to cause a pin to eject a wafer;
   a torsion meter configured to measure a torque of the protection mechanism in a process of ejecting the wafer by the pin; and
   a control module configured to receive the torque measured by the torsion meter and to compare the measured torque with a reference torque, wherein:
   the control module is configured, in response to the measured torque exceeding an allowable range of the reference torque, to at least one of send an alarm signal or stop the drive,
   the reference torque is pre-measured by the torsion meter when the wafer is normally ejected, and
   the reference torque linearly decreases with a distance of the pin away from an original position.

2. The protection mechanism according to claim 1, wherein the torsion meter is between the drive and the linear unit.

3. The protection mechanism according to claim 2, further comprising a first connector and a second connector, wherein:
   the first connector is between the drive and the torsion meter, and
   the second connector is between the torsion meter and the linear unit.

4. The protection mechanism according to claim 1, wherein the allowable range of the reference torque is between 0.7 to 1.3, inclusive, times the reference torque.

5. The protection mechanism according to claim 1, further comprising a pin support plate that is configured to push against the pin, wherein the linear unit is connected between the drive and the pin support plate such that the linear unit is configured to push the pin support plate to move the pin upward and eject the wafer.

6. The protection mechanism according to claim 5, wherein the pin support plate is sleeved on a central shaft of a wafer carrying apparatus, the linear unit being disposed parallel to the central shaft of the wafer carrying apparatus, and separated from the central shaft.

7. The protection mechanism according to claim 1, wherein the linear unit is connected between the drive and a wafer carrying apparatus such that the wafer carrying apparatus moves downward to cause the pin to eject the wafer.

8. The protection mechanism according to claim 7, wherein:
   the pin is one of a plurality of pins,
   the plurality of pins are disposed parallel to each other through the wafer carrying apparatus,
   one end of each pin of the plurality of pins is fixed to a bottom of a cavity, and
   the other end of each pin of the plurality of pins is configured to protrude from the wafer carrying apparatus.

9. The protection mechanism according to claim 7, wherein the linear unit is connected to a central shaft of the wafer carrying apparatus.

10. A method for protecting a wafer and a pin, comprising:
    driving a linear unit, with a drive, to cause the pin to eject the wafer;
    measuring a torque of the linear unit by with a torsion meter;
    receiving, at a control module, the torque from the torsion meter; and
    comparing, with the control module, the torque with a reference torque, and in response to the comparing of the torque with the reference torque resulting in the torque exceeding an allowable range of the reference torque at least one of:
    sending an alarm signal; or
    stopping the drive; wherein
    the reference torque is pre-measured by the torsion meter when the wafer is normally ejected, and
    the reference torque linearly decreases with a distance of the pin away from an original position.

11. The method according to claim 10, wherein the allowable range is between 0.7 to 1.3 times, inclusive, the reference torque.

12. The method according to claim 10, wherein driving the linear unit to cause the pin to eject the wafer comprises pushing, with the linear unit, a pin support plate that pushes against the pin, to move the pin upward to eject the wafer.

13. The method according to claim 12, wherein the pin support plate is sleeved on a central shaft of a wafer carrying apparatus, the linear unit being disposed parallel to the central shaft of the wafer carrying apparatus, and separated from the central shaft.

14. The method according to claim 10, wherein driving the linear unit to cause the pin to eject the wafer comprises pulling down a wafer carrying apparatus, to move the wafer carrying apparatus downward and cause the pin to eject the wafer.

15. The method according to claim 14, wherein:
the pin is one of a plurality of pins,
the plurality of pins are disposed parallel to each other through the wafer carrying apparatus,
one end of each pin of the plurality of pins is fixed to a bottom of a cavity, and
the other end of each pin of the plurality of pins is configured to protrude from the wafer carrying apparatus.

16. The method according to claim 14, wherein the linear unit is connected to a central shaft of the wafer carrying apparatus.

* * * * *